(12) United States Patent
Terao

(10) Patent No.: US 8,808,877 B2
(45) Date of Patent: Aug. 19, 2014

(54) ORGANIC ELECTROLUMINESCENT ELEMENT AND METHOD OF MANUFACTURING THE SAME

(75) Inventor: Yutaka Terao, Matsumoto (JP)

(73) Assignee: Sharp Kabushiki Kaisha, Osaka (JP)

( * ) Notice: Subject to any disclaimer, the term of this patent is extended or adjusted under 35 U.S.C. 154(b) by 489 days.

(21) Appl. No.: 12/737,747

(22) PCT Filed: Aug. 18, 2009

(86) PCT No.: PCT/JP2009/064471
§ 371 (c)(1),
(2), (4) Date: Aug. 26, 2011

(87) PCT Pub. No.: WO2011/021280
PCT Pub. Date: Feb. 24, 2011

(65) Prior Publication Data
US 2011/0297917 A1 Dec. 8, 2011

(51) Int. Cl.
*H01L 51/54* (2006.01)
*C09K 11/06* (2006.01)
*H05B 33/14* (2006.01)
*H01L 51/50* (2006.01)
*H01L 51/52* (2006.01)
*H01L 51/00* (2006.01)

(52) U.S. Cl.
CPC ......... *C09K 11/06* (2013.01); *H01L 2251/5323* (2013.01); *H01L 2251/5315* (2013.01); *H05B 33/14* (2013.01); *H01L 51/5048* (2013.01); *H01L 51/5234* (2013.01); *H01L 51/0081* (2013.01); *H01L 51/0068* (2013.01); *C09K 2211/1458* (2013.01); *Y10S 428/917* (2013.01)
USPC ........... 428/690; 428/917; 313/504; 313/505; 313/506; 257/40; 257/E51.05; 257/E51.026; 257/E51.032; 546/18; 546/70; 546/81; 546/101; 548/304.1; 548/418; 548/440; 548/444

(58) Field of Classification Search
USPC .................. 428/690, 917; 313/504, 505, 506; 257/40, E51.05, E51.026, E51.032; 546/18, 70, 81, 101; 548/304.1, 418, 548/440, 444
See application file for complete search history.

(56) References Cited

U.S. PATENT DOCUMENTS

| 6,030,715 A | 2/2000 | Thompson et al. |
| 2003/0082858 A1 | 5/2003 | Morii et al. |

(Continued)

FOREIGN PATENT DOCUMENTS

| JP | 7-086634 A | 3/1995 |
| JP | 2001-520450 T | 10/2001 |

(Continued)

OTHER PUBLICATIONS

Cicoira et al., Organic Light Emitting Transistors Based on Solution-Cast and Vacuum-Sublimed Films of Rigid Core Thiophene Oligomer, 2006, Advanced Materials, vol. 18, pp. 169-174.*

(Continued)

*Primary Examiner* — Gregory Clark
(74) *Attorney, Agent, or Firm* — Rabin & Berdo, P.C.

(57) ABSTRACT

A method of manufacturing an organic EL element, which may be a top-emitting or a transparent organic EL element, provides an organic EL element having a low driving voltage and a high efficiency. The organic EL element includes a substrate; an anode; an organic EL layer which includes at least an emissive layer, an electron transport layer and a damage-mitigating electron injection layer; and a transparent cathode composed of a transparent conductive oxide material, the damage-mitigating electron injection layer is in contact with the transparent cathode, and the damage-mitigating electron injection layer includes a crystalline oligothiophene compound.

9 Claims, 1 Drawing Sheet

(56) References Cited

U.S. PATENT DOCUMENTS

| | | | |
|---|---|---|---|
| 2003/0099774 A1 | 5/2003 | Morii et al. | |
| 2004/0219389 A1* | 11/2004 | Lee et al. | 428/690 |
| 2008/0100213 A1 | 5/2008 | Iwakuma et al. | |
| 2009/0159876 A1 | 6/2009 | Ohba et al. | |

FOREIGN PATENT DOCUMENTS

| | | | | |
|---|---|---|---|---|
| JP | 2002-322173 A | | 11/2002 | |
| JP | 2003-192499 A | | 7/2003 | |
| JP | 2003-234522 A | | 8/2003 | |
| JP | 2006-066553 A | | 3/2006 | |
| JP | 2007-116115 A | | 5/2007 | |
| JP | 2008-112904 A | | 5/2008 | |
| JP | 2009-040857 A | | 2/2009 | |
| KR | 2002-0063399 | * | 8/2002 | H05B 33/22 |

OTHER PUBLICATIONS

Melucci et al., Liquid-Crystalline Rigid-Core Semiconductor Oligothiophenes: Influence of Molecular Structure on Phase Behavior and Thin-Film Properties, 2007, Chem. Eur., vol. 12, pp. 10046-10054.*

Shirota et al., Charge Carrier Transporting Molecular Materials and Their Applications in Devices, 2007, Chemical Reviews, vol. 107, pp. 953-1010.*

Gilles Horowitz et al., "The oligothiophene-based field-effect transistor: How it works and how to improve it", J. Appl. Phys. 67 (1), pp. 528-532, Jan. 1, 1990.

Marcus Halik et al., "High-mobility organic thin-film transistors based on $\alpha, \alpha'$-didecyloligothiophenes," Journal of Applied Physics, vol. 93 (5), pp. 2977-2981, Mar. 1, 2003.

Toshinori Matsushima et al., "Extremely low voltage organic light-emitting diodes with $p$-doped alpha-sexithiophene hole transport and $n$-doped phenyldipyrenylphosphine oxide electron transport layers", Applied Physics Letters 89, pp. 253506-1-253506-3 (2006).

V. Bulovic et al., "Transparent light-emitting devices", Nature, vol. 380, p. 29, Mar. 7, 1996.

V. Bulovic et al., "A surface-emitting vacuum-deposited organic light emitting device", Appl. Phys. Lett. 70 (22), pp. 2954-2956, Jun. 2, 1997.

G. Parthasarathy et al., "A metal-free cathode for organic semiconductor devices", Applied Physics Letters, vol. 72 (17), pp. 2138-2140, Apr. 27, 2008.

* cited by examiner

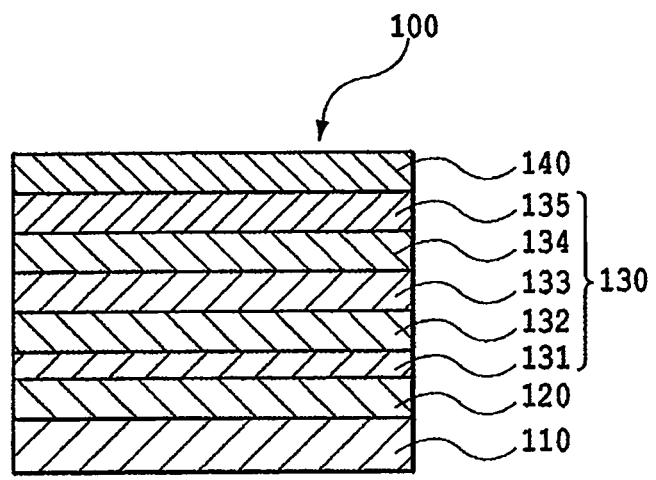

ORGANIC ELECTROLUMINESCENT ELEMENT AND METHOD OF MANUFACTURING THE SAME

BACKGROUND OF THE INVENTION

1. Field of the Invention

The present invention relates to an organic electroluminescent element (also referred to below as an "organic EL element") which can be employed in flat panel displays and as a light source for illumination. In particular, the object of the invention is to provide a low power consumption transparent organic EL element and a top-emitting organic EL element.

2. Background of the Related Art

Because organic EL elements can be driven at a low voltage and a high current density, they are able to achieve a high luminance and emission efficiency. In recent years, organic EL elements have been put to practical use in flat panel displays such as liquid-crystal displays, and also show promise as a light source for illumination.

An organic EL element has an anode, a cathode, and an organic EL layer sandwiched between the anode and the cathode. Luminescence by an organic EL element is achieved by the emission of light that occurs with relaxation of the excitation energy of excitons generated by the recombination of holes injected into the highest occupied molecular orbital (HOMO) of the emissive layer material within the organic EL layer with electrons injected into the lowest unoccupied molecular orbital (LUMO). The HOMO level of the emissive layer material is generally measured as the ionization potential, and the LUMO level is generally measured as the electron affinity. Generally, to efficiently carry out hole and electron injection into the emissive layer, the organic EL layer has a stacked structure which, in addition to an emissive layer, includes any or all of the following: a hole injection layer, a hole transport layer, an electron transport layer and an electron injection layer.

In an organic EL element, EL light from the emissive layer is emitted from either the anode or the cathode, or from both sides. It is desired that the electrode on the light-emitting side have a high transmittance to EL light from the emissive layer. Transparent conductive oxide (TCO) materials (e.g., indium-tin oxide (ITO), indium-zinc oxide (IZO), indium-tungsten oxide (IWO)) are generally used as such electrode materials. Because TCO materials have a relatively large work function of about 5 eV, an electrode formed of a TCO material may be used as the electrode for injecting holes to the organic EL layer (i.e., as the anode).

Organic EL elements of a type which output light from the supporting substrate side (bottom-emitting (Btm-Em) organic EL elements) have hitherto been common. Such organic EL elements are obtained by forming, on a transparent supporting substrate, an anode composed of a TCO material as the bottom electrode; forming on the anode an organic EL layer having, in order, a hole injection and transport layer, an emissive layer, and an electron injection and transport layer; and forming as the top electrode on the organic EL layer a cathode composed of a film of metal such as aluminum.

Recently, in applications as flat panel displays, active matrix (AM) drive organic EL displays wherein a switching element composed of an amorphous silicon or polysilicon thin-film transistor (TFT) is provided at each pixel and an organic EL element is formed thereon have become predominant, the reason being that displays having a high luminance and a low power consumption can thereby be achieved. At this time, to prevent a decrease in the aperture ratio (light-emitting surface area) of the pixels due to the opacity of the switching elements, it is desirable to employ organic EL elements of a type which has a reflective bottom electrode and a transparent top electrode and emits light from the film formation side (top-emitting (Top-Em) organic EL elements).

With regard to organic EL elements having a transparent top electrode and a reflective bottom electrode, *Nature*, Vol. 380, (1996), p. 29, describes an organic EL element having a structure that includes a reflective bottom electrode as the anode; an organic EL layer composed of a hole injection/transport layer, an emissive layer, and an electron injection/transport layer which are formed in this order; and a transparent top electrode as the cathode. *Applied Physics Letters*, Vol. 70, No. 22 (1997), p. 2954, describes an organic EL element having a structure that includes a reflective bottom electrode as the cathode; an organic EL layer composed of an electron injection/transport layer, an emissive layer, and a hole injection/transport layer which are formed in this order; and a transparent top electrode as the anode. Particularly in cases where polysilicon-TFTs are used as the switching elements, it is important for a transparent top electrode to serve as the cathode. This is because, from the standpoint of the switching circuit construction, the bottom electrode is generally used as the anode.

The transparent top electrode is sometimes formed using a metal thin-film of Mg—Ag alloy or the like. In such a case, to obtain a sufficient damage mitigating effect using a metal thin-film, it is necessary to increase the thickness of the metal thin-film. However, increasing the thickness of the metal thin-film leads to a rise in visible light absorbance, resulting in the absorption of EL light from the emissive layer and lowering the intensity of light emission by the organic EL element. Metal thin-films also exhibit a strong microcavity effect attributable to the high reflectance. Due to the microcavity effect, the thickness of the organic EL layer which determines the distance between the reflective bottom electrode and the metal thin-film significantly alters the viewing angle dependence of the emission color and the viewing angle dependence of the emission intensity. Accordingly, there exists a need for very precise control of the film thickness distribution in the organic EL layer (especially the film thickness distribution within the display region). In light of the above, it is desired that the TCO materials hitherto used in anode formation be used in cathode formation.

However, a problem with the emissive layer material and the electron injection/transport material, which are organic substances, is that they readily oxidize when a TCO material is formed thereon by sputtering or the like, causing a deterioration in function and thus a significant loss in the emission efficiency of the organic EL element. An approach hitherto used to prevent oxidative deterioration of the emissive layer material and the electron injection/transport material has been to provide a damage-mitigating electron injection layer between the electron transport layer and the top electrode made of a TCO material. *Nature*, Vol. 380, (1996), p. 29, proposes using, as such a damage-mitigating electron injection layer, a Mg—Ag alloy thin-film layer hitherto employed as a cathode material. In addition, *Applied Physics Letters*, Vol. 72, No. 17 (1998), p. 2138, and Japanese Translation of PCT Application No. 2001-520450, propose using, as such a damage-mitigating electron injection layer, a copper phthalocyanine (CuPC) thin-film, a zinc phthalocyanine (ZnPC) thin film or the like.

Japanese Translation of PCT Application No. 2001-520450, states that it is desirable for an organic semiconductor material which, when combined with a TCO layer, is capable of carrying out efficient electron injection and provide the following characteristics.

(1) Sufficient chemical and structural stability to limit damage due to sputtering at the time of ITO layer formation. Large, planar molecules such as phthalocyanine, naphthalocyanine and perylene are preferred. Derivatives of the above compounds in which conjugation by these molecules has been further extended (e.g., compounds in which a benzene ring, naphthalene ring, anthracene ring, phenanthrene ring, polyacene ring or the like has been additionally fused) may be used. In specific circumstances, a polymer material may be used.

(2) Sufficient electron mobility to function as an electron transport layer. Although a larger carrier mobility is preferred, in general, materials having carrier mobilities of at least $10^{-6}$ cm$^2$/V s are thought to be sufficient to function as an electron transport layer. In such cases as well, typical examples include large, planar molecules such as phthalocyanine and specific perylene.

Also, as mentioned in *Journal of Applied Physics*, Vol. 67, No. 1 (1990), p. 528, and *Journal of Applied Physics, Vol. 93*, No. 5 (2003), p. 2977, oligothiophene compounds are recognized as p-type organic semiconductors having relatively large field-effect hole mobilities ($10^{-4}$ to 1 cm$^2$/V s). In addition, *Applied Physics Letters*, Vol. 89, No. 25 (2006), p. 253506, and Japanese Patent Application Laid-open No. 2008-112904, disclose the use of oligothiophene compounds as hole transport materials in organic EL elements.

A damage-mitigating electron injection layer formed of CuPC or the like is able to alleviate the problem of visible light absorption when a metal thin-film is used. However, *Applied Physics Letters*, Vol. 72, No. 17 (1998), p. 2138, mentions that, with regard to electron injectability from a cathode made of a TCO material into an electron transport layer, a damage-mitigating electron injection layer formed of CuPC or the like is inferior to a Mg—Ag alloy thin-film. The decrease in electron injectability invites a rise in the organic EL element driving voltage. Accordingly, there exists a desire for a damage-mitigating electron injection layer which, in addition to having a good light transmittance and a good damage-mitigating ability when the top electrode is formed by a sputtering process, also has an excellent electron injectability from a cathode made of a TCO material to the electron transport layer.

It is therefore an object of the present invention to provide a damage-mitigating electron injection layer which excels in all of the following: light transmittance, damage-mitigating properties and electron injectability. A further object of the invention is to provide a Top-Em organic EL elements and transparent organic EL elements which use such a layer and have a high efficiency at a low driving voltage.

SUMMARY OF THE INVENTION

The present invention is based on the discovery that, by making use of an oligothiophene compound (particularly a crystalline oligothiophene compound) hitherto employed as a hole transport material to form an electron injection layer, it is possible to provide, at no sacrifice to the light transmittance, an organic EL element having a low driving voltage by using a TCO material to form a top transparent cathode while preventing deterioration of the organic EL layer.

By using a crystalline oligothiophene compound to form an electron injection layer, even when a TCO material is deposited by a sputtering process to form a top transparent cathode, oxidative deterioration of the emissive layer and the electron transport layer can be prevented. Moreover, because the electron injection layer composed of the oligothiophene compound can efficiently extract electrons from the cathode made of TCO material, it is possible to achieve a Top-Em organic EL element and a transparent organic EL element which have a low driving voltage and a high efficiency.

Thus, the invention provides an organic EL element comprising, in the order recited: a substrate; an anode; an organic EL layer which includes at least an emissive layer, an electron transport layer and a damage-mitigating electron injection layer; and a transparent cathode composed of a transparent conductive oxide material, the damage-mitigating electron injection layer is in contact with the transparent cathode, and the damage-mitigating electron injection layer includes a crystalline oligothiophene compound.

The crystalline oligothiophene compound may be represented by formula (1) below:

(1)

where $X^1$ and $X^2$ are each independently selected from the group consisting of hydrogen and substituted or unsubstituted monovalent radicals, and n is an integer from 3 to 14. In formula (1), n may be an integer from 4 to 6, and $X^1$ and $X^2$ may be selected from the group consisting of hydrogen, unsubstituted alkyls having from 1 to 20 carbons and cycloalkyls having from 3 to 20 carbons.

The crystalline oligothiophene compound may be represented by formula (2) below:

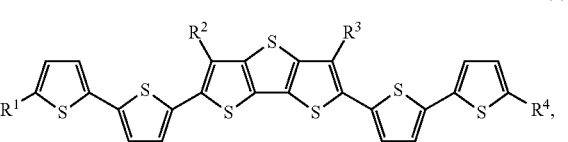

(2)

where $R^1$, $R^2$, $R^3$ and $R^4$ are each independently selected from the group consisting of hydrogen and substituted or unsubstituted monovalent radicals. In formula (2), $R^1$ and $R^4$ both may be n-hexyl, and $R^2$ and $R^3$ both may be methyl.

The electron injection layer may further include a substance which exhibits electron-donating properties with respect to the crystalline oligothiophene compound. The substance which exhibits electron-donating properties may be selected from the group consisting of alkali metals and alkaline earth metals, wherein the alkali metals are selected from the group consisting of lithium, potassium, sodium, rubidium and cesium, and wherein the alkaline earth metals are selected from the group consisting of beryllium, magnesium, calcium, strontium and barium. The substance which exhibits electron-donating properties may be selected from the group consisting of alkali metal oxides, alkali metal halides, alkali metal carbonates, alkali metal chelate compounds, alkaline earth metal oxides, alkaline earth metal halides, alkaline earth metal carbonates and alkaline earth metal chelate compounds, wherein the alkali metal may be selected from the group consisting of lithium, potassium, sodium, rubidium and cesium, and wherein the alkaline earth metal is selected from the group consisting of beryllium, magnesium, calcium, strontium and barium.

The present invention additionally provides a method of manufacturing the organic EL element includes the steps of: forming an anode on a substrate; forming, on the anode, an organic EL layer which includes at least an emissive layer, an electron transport layer and a damage-mitigating electron injection layer; and forming, on the organic EL layer, a transparent cathode composed of a transparent conductive oxide material, wherein the damage-mitigating electron injection layer is formed by using a vacuum evaporation process to deposit a crystalline oligothiophene compound.

BRIEF DESCRIPTION OF THE DRAWINGS

FIG. 1 is a schematic diagram showing the organic EL element of the present invention.

DETAILED DESCRIPTION OF THE INVENTION

FIG. 1 shows a schematic structural view of an organic EL element 100 according to the present invention. This organic EL element 100 includes, in order, a substrate 110, an anode 120, an organic EL layer 130 and a transparent cathode 140. The organic EL layer 130 has, in order from the anode 120 side, a hole injection layer (HIL) 131, a hole transport layer (HTL) 132, an emissive layer (EML) 133, an electron transport layer (ETL) 134, and a damage-mitigating electron injection layer (EIL) 135. Here, the transparent cathode 140 is formed using a TCO material, and the damage-mitigating electron injection layer 135 is formed using a crystalline oligothiophene compound. In the structure exemplified in FIG. 1, by having the anode 120 or the substrate 110 be non-light-transmitting, the organic EL element 100 can be made a Top-Em organic EL element which emits light only from the transparent cathode 140 side. Alternatively, by having the anode 120 and the substrate 110 be light-transmitting, the organic EL element 100 can be made a transparent organic EL element which emits light from both the substrate 110 side and the transparent cathode 140 side.

In the arrangement shown in FIG. 1, the emissive layer 133, the electron transport layer 134 and the damage-mitigating electron injection layer 135 are essential component layers of the organic EL layer 130 of the invention. The emissive layer 133 is a layer which recombines injected carriers to generate excitons, and emits light via relaxation of the energy of the resulting excitons. The electron transport layer 134 which adjoins the emissive layer 133 is a layer having: (1) the function of efficiently injecting electrons into the emissive layer 133, and (2) the function of preventing the leakage of holes from the emissive layer 133 to the transparent cathode 140 side, the purpose of which layer is to lower the driving voltage and increase the emission efficiency. The damage-mitigating electron injection layer 135 is a layer which has the function of extracting electrons from the transparent cathode 140 and causing them to migrate to the electron transport layer 134, and the function of preventing oxidative deterioration of the emissive layer 133 and the electron transport layer 134 during formation of the transparent cathode 140.

The hole injection layer 131 and the hole transport layer 132 are layers which may be optionally provided in the organic EL layer 130 of the invention. Providing these layers enables highly efficient light emission to be easily achieved by adjusting the balance between electrons and holes injected into the emissive layer 133.

The respective layers are each described in detail below.

Substrate 110:

Substrates 110 that can be used in the present invention include not only the alkali glass substrates and non-alkali glass substrates commonly used in flat panel displays, but also silicon substrates, plastic substrates made of polycarbonate or the like, and substrates obtained by forming a dielectric film on plastic film or stainless steel foil. When fabricating a Top-Em organic EL element, it is not necessary for the substrate 110 to be transparent. On the other hand, when fabricating a transparent organic EL element, it is necessary for the substrate 110 to be light-transmitting, and in particular visible light-transmitting.

In cases where a substrate which is gas-permeable, and is permeable in particular to steam and/or oxygen (e.g., plastic substrates), is used as the substrate 110, a film having a gas barrier function must be separately formed on top of the gas-permeable substrate.

Anode 120:

The anode 120 used in the present invention may be either light-transmitting or light-reflecting. A light-transmitting anode 120 may be formed using a commonly known TCO material, such as indium-tin oxide (ITO), indium-zinc oxide (IZO), indium-tungsten oxide (IWO), aluminum-doped zinc oxide (AZO), and gallium-doped zinc oxide (GZO). Alternatively, the anode 120 may be formed using a highly conductive polymeric material such as poly(3,4-ethylene dioxythiophene):poly(styrenesulfonate) (PEDOT:PSS). When a light-transmitting anode 120 is formed on a light-transmitting substrate 110, the resulting organic EL element 100 is a transparent organic EL element.

Alternatively, a light-reflecting anode 120 may be a single layer or multilayer stack of a light-reflecting metal material, or may be a stacked structure composed of the above transparent conductive film (including a TCO material and a highly conductive polymeric material) and a light-reflecting metal material. Alternatively, a light-reflecting structure may be obtained by forming on a substrate 110 a light-reflecting layer composed of a metal film and a dielectric layer (neither of which is shown), and forming thereon an anode 120 composed of a transparent conductive film. When a light-reflecting anode 120 has been used and a light-reflecting structure has been formed, the resulting organic EL element 100 becomes a Top-Em organic EL element.

Metal materials that may be used to form the light-reflecting anode 120 or the light-reflecting layer include high-reflectance metals, high-reflectance amorphous alloys, and high-reflectance microcrystalline alloys. High-reflectance metals include aluminum, silver, tantalum, zinc, molybdenum, tungsten, nickel and chromium. High-reflectance amorphous alloys include NiP, NiB, CrP and CrB. High-reflectance microcrystalline alloys include NiAl and silver alloys.

When the above-described TCO material, high-reflectance metal, high-reflectance amorphous alloy and high-reflectance microcrystalline alloy are used, an anode 120 or a component layer thereof can be formed by any method known to the art, such as a vapor deposition process or sputtering. When a high-conductivity polymeric material such as PEDOT:PSS is used, the anode 120 or a component layer thereof may be formed by any method known to the art, such as spin-coating, an inkjet process or printing.

Organic EL Layer 130:

Hole Injection Layer 131:

The hole injection layer 131 is a layer which may be optionally provided in the organic EL element of the invention. The hole injection layer 131 facilitates the injection of holes from the anode 120, and is effective for adjusting the balance between holes and electrons in the emissive layer 133. Materials that may be used in the hole injection layer 131 include hole transport materials commonly used in organic EL elements or organic TFT elements, such as materials having a triarylamine moiety, a carbazole moiety or an oxadiazole moiety.

Specifically, the hole injection layer 131 may be formed using, for example, N,N'-diphenyl-N,N'-bis(3-methylphenyl)-1,1'-biphenyl-4,4'-diamine (TPD), N,N,N',N'-tetrakis(4-methoxyphenyl)-benzidine (MeO-TPD), 4,4',4''-tris{1-naphthyl(phenyl)amino}triphenylamine (1-TNATA), 4,4',4''-tris{2-naphthyl(phenyl)amino}triphenylamine (2-TNATA), 4,4',4''-tris(3-methylphenylphenylamino)triphenylamine (m-MTDATA), 4,4'-bis{N-(1-naphthyl)-N-phenylamino}biphenyl (NPB), 2,2',7,7'-tetrakis(N,N-diphenylamino)-9,9'-spirobifluorene (Spiro-TAD), N,N'-di(biphenyl-4-yl)-N,N'-diphenyl-(1,1'-biphenyl)-4,4'-diamine (p-BPD), tri(o-terphenyl-4-yl)amine (o-TTA), tri(p-terphenyl-4-yl)amine (p-TTA), 1,3,5-tris[4-(3-methylphenylphenylamino)phenyl]benzene (m-MTDAPB) and 4,4',4''-tris-9-carbazolyltriphenylamine (TCTA). Alternatively, aside from these common materials, the hole injection layer 131 may be formed using, for example, hole injection materials commercially available from various organic electronic material manufacturers.

An electron-accepting dopant may be added (p-type doping) to the hole injection layer 131 formed of the above-described material. The electron-accepting dopant used may be either an organic semiconductor or an inorganic semiconductor. Organic semiconductors that may be used include tetracyanoquinodimethane derivatives containing 2,3,5,6-tetrafluoro-7,7,8,8-tetracyanoquinodimethane ($F_4$-TCNQ). Inorganic semiconductors that may be used include molybdenum oxide ($MoO_3$), tungsten oxide ($WO_3$) and vanadium oxide ($V_2O_5$).

The hole injection layer 131 may be formed by resistance heating evaporation, electron beam evaporation or the like using the above-described hole transport material and electron-accepting dopant (when present).

Hole Transport Layer 132:

The hole transport layer 132 is a layer that may be optionally provided in the organic EL element of the invention. The hole transport layer 132 facilitates the transfer of holes from the anode 120 or the hole injection layer 131 to the emissive layer 133, prevents the leakage of electrons from the emissive layer 133, and adjusts the balance between holes and electrons in the emissive layer 133. The hole transport layer 132 may be formed by using any material selected from among hole transport materials that may be used in the above-described organic EL element or the organic TFT element. Generally, from the standpoint of enhancing hole injectability into the emissive layer 133, it is desirable to form the hole transport layer 132 using a material which satisfies the following relationship:

$$Wa \leq Ip(\text{HIL}) < Ip(\text{HTL}) < Ip(\text{EML})$$

(wherein Wa is the work function of the anode, Ip(HIL) is the ionization potential of the hole injection layer 131, Ip(HTL) is the ionization potential of the hole transport layer 132, and Ip(EML) is the ionization potential of the emissive layer 133).

The hole transport layer 132 may be formed by a vapor deposition process such as resistance heating evaporation or electron beam evaporation using the above-described hole transport material.

Emissive Layer 133:

In the organic EL element of the present invention, holes injected from the anode 120 and electrons injected from the transparent cathode 140 recombine within the emissive layer 133, generating excitons. Light emission arises by relaxation of the excitation energy of the generated excitons. The material of the emissive layer may be selected in accordance with the desired color. By way of illustration, examples of materials that may be used for obtaining luminescence which is blue to blue-green include fluorescent whitening agents such as benzothiazole, benzoimidazole and benzoxazole fluorescent whitening agents, styrylbenzene compounds and aromatic dimethylidyne compounds. More specifically, an emissive layer 133 which emits light that is blue to blue-green can be formed using 9,10-di(2-naphthyl)anthracene (ADN), 4,4'-bis(2,2'-diphenylvinyl)biphenyl (DPVBi), 2-methyl-9,10-di(2-naphthyl)anthracene (MADN), 9,10-bis(9,9-bis(n-propyl)fluoren-2-yl)anthracene (ADF) and 9-(2-naphthyl)-10-(9,9-bis(n-propyl)fluoren-2-yl)anthracene (ANF).

The emissive layer 133 may be formed by doping the above material with a fluorescent dye (light-emitting dopant). The fluorescent dye used as the light-emitting dopant may be selected according to the desired color. For example, any of the following known compounds may be used as the dopant: condensed ring derivatives such as perylene and rubrene; quinacridone derivatives; phenoxazone 660; 4,4'-bis(2-(4-(N,N-diphenylamino)phenyl)vinyl)biphenyl (DPAVBi); dicyanomethylene derivatives such as 4-(dicyanomethylene)-2-methyl-6-(p-dimethylaminostyryl)-4H-pyran (DCM), 4-(dicyanomethylene)-6-methyl-2-[2-(julolidin-9-yl)ethyl]-4H-pyran (DCM2), 4-(dicyanomethylene)-2-methyl-6-(1,1,7,7-tetramethyljulolidin-9-enyl)-4H-pyran (DCJT) and 4-(dicyanomethylene)-2-t-butyl-6-(1,1,7,7-tetramethyljulolidin-9-enyl)-4H-pyran (DCJTB); perinone, coumarin derivatives, pyromethane derivatives and cyanine dyes. In the present invention, a plurality of light-emitting dopants may be added to the emissive layer 133 so as to adjust the color tone of the light to be emitted.

The emissive layer 133 may be formed by a vapor deposition process such as resistance heating evaporation or electron beam evaporation which uses the above-described emissive layer material and light-emitting dopant (where present).

Electron Transport Layer 134:

In the present invention, the electron transport layer 134 provided between the emissive layer 133 and the damage-mitigating electron injection layer 135 is important for ensuring the performance of the organic EL element 100. From the standpoint of excellent electron transportability from the damage-mitigating electron injection layer 135 to the emissive layer 133, it is desirable that the electron affinity of the material making up the electron transport layer 134 have a value midway between the electron affinity of the emissive layer 133 material and the electron affinity of the damage-mitigating electron injection layer 135 material. Moreover, to prevent the leakage of holes injected to the emissive layer 133, it is desirable that the electron transport layer 134 have an ionization potential Ip(ETL) which is larger than the ionization potential Ip(EML) of the emissive layer 133. A material for forming the electron transport layer 134 may be selected from among commonly known organic electron transporting materials, provided the above conditions are satisfied.

Illustrative examples of electron transporting materials that may be used for this purpose include the following: triazole derivatives such as 3-phenyl-4-(1'-naphthyl)-5-phenyl-1,2,4-triazole (TAZ); oxadiazole derivatives such as 1,3-bis[(4-t-butylphenyl)-1,3,4-oxadiazole]phenylene (OXD-7), 2-(4-biphenyryl)-5-(4-t-butylphenyl)-1,3,4-oxadiazole (PBD) and 1,3,5-tris(4-t-butylphenyl-1,3,4-oxadiazolyl)benzene (TPOB); thiophene derivatives such as 5,5'-bis(dimethylboryl)-2,2'-bithiophene (BMB-2T) and 5,5''-bis(dimesitylboryl)-2,2':5',2''-terthiophene (BMB-3T); aluminum complexes such as aluminum tris(8-quinolinolate) ($Alq_3$);

phenanthroline derivatives such as 4,7-diphenyl-1,10-phenanthroline (BPhen) and 2,9-dimethyl-4,7-diphenyl-1,10-phenanthroline (BCP); and silole derivatives such as 2,5-di-(3-biphenyl)-1,1-dimethyl-3,4-diphenylsilacyclopentadiene (PPSPP), 1,2-bis(1-methyl-2,3,4,5-tetraphenylsilacyclopentadienyl)ethane (2PSP) and 2,5-bis-(2,2-bipyridin-6-yl)-1,1-dimethyl-3,4-diphenylsilacyclopentadiene (PyPySPyPy). The electron transport layer 134 may be formed by a vapor deposition process such as resistance heating evaporation or electron beam evaporation which uses the foregoing electron transport materials.

Damage-Mitigating Electron Injection Layer 135:

In the present invention, the crystalline oligothiophene compound used in the electron injection layer may be a material commonly generally employed in organic transistors, organic electroluminescent transistors and the like. The layer may be formed by a vapor phase growth process such as vacuum heating evaporation or laser vaporization film formation (also called pulsed laser deposition and laser ablation), and the thin-film thereby formed preferably is of a polycrystalline or other crystalline nature. Moreover, it is preferable for this layer to have excellent electron injectability into the adjoining electron transport layer or emissive layer. As used herein, "crystalline" means that a given compound exhibits a significant X-ray diffraction peak.

It is preferable to form the damage-mitigating electron injection layer 135 by using a crystalline oligothiophene compound of the structure shown in formula (1) below.

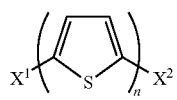

(1)

Here, $X^1$ and $X^2$ are each independently selected from the group consisting of hydrogen and substituted or unsubstituted monovalent radicals. Preferably, $X^1$ and $X^2$ are each selected from the group consisting of hydrogen, substituted or unsubstituted alkyl radicals of 1 to 20 carbons, substituted or unsubstituted cycloalkyl radicals of 3 to 20 carbons, haloalkyl radicals of 1 to 20 carbons, alkoxy radicals of 1 to 20 carbons and alkenyl radicals of 2 to 20 carbons.

The letter n represents an integer, and is preferably from 3 to 8. The crystalline oligothiophene compound of formula (1) preferably has a partial structure selected from the group consisting of terthiophene, quaterthiophene, quinquethiophene, sexithiophene, septithiophene and octithiophene structures.

Examples of unsubstituted alkyl radicals that may be used as $X^1$ and $X^2$ include methyl, ethyl, n-propyl, isopropyl, n-butyl, s-butyl, isobutyl, t-butyl, n-pentyl, n-hexyl, n-heptyl, n-octyl, n-nonyl, n-decyl, n-undecyl, n-dodecyl, n-tridecyl, n-tetradecyl, n-pentadecyl, n-hexadecyl, n-heptadecyl, n-octadecyl, neopentyl, 2-hexyl, 2-methylpentyl, 6-undecyl, 5-nonyl, 6-pentadecyl and 3-methylpentyl.

Examples of hydroxyl-substituted alkyl radicals that may be used as $X^1$ and $X^2$ include hydroxymethyl, 1-hydroxyethyl, 2-hydroxyethyl, 2-hydroxy-2-methyl, 1,2-dihydroxyethyl, 1,3-dihydroxyisopropyl (1,3-dihydroxy-2-propyl) and 1,2,3-trihydroxypropyl.

Examples of amino-substituted alkyl radicals that may be used as $X^1$ and $X^2$ include aminomethyl, 1-aminoethyl, 2-aminoethyl, 2-amino-2-methylpropyl, 1,2-diaminoethyl, 1,3-diamino-2-propyl and 1,2,3-triaminopropyl.

Examples of cyano-substituted alkyl radicals that may be used as $X^1$ and $X^2$ include cyanomethyl, 1-cyanoethyl, 2-cyanoethyl, 2-cyano-2-methylpropyl, 1,2-dicyanoethyl, 1,3-dicyano-2-propyl and 1,2,3-tricyanopropyl.

Examples of nitro-substituted alkyl radicals that may be used as $X^1$ and $X^2$ include nitromethyl, 1-nitroethyl, 2-nitroethyl, 1,2-dinitroethyl and 1,2,3-trinitropropyl.

Examples of substituted or unsubstituted cycloalkyl radicals which may be used as $X^1$ and $X^2$ include cyclopentyl, cyclohexyl, cyclooctyl and 3,5-tetramethylcyclohexyl.

Examples of haloalkyl radicals having from 1 to 20 carbons which may be used as $X^1$ and $X^2$ include fluoromethyl, difluoromethyl, trifluoromethyl, pentafluoroethyl, chloromethyl, 1-chloroethyl, 2-chloroethyl, 2-chloro-2-methylpropyl, 1,2-dichloroethyl, 1,3-dichloro-2-propyl, 1,2,3-trichloropropyl, bromoethyl, 1-bromoethyl, 2-bromoethyl, 2-bromo-2-methylpropyl, 1,2-dibromoethyl, 1,3-dibromo-2-propyl, 1,2,3-tribromopropyl, iodomethyl, 1-iodoethyl, 2-iodoethyl, 2-iodo-2-methylpropyl, 1,2-iodoethyl, 1,3-diiodo-2-propyl and 1,2,3-triiodopropyl. The haloalkyl is preferably selected from among fluoromethyl, difluoromethyl and trifluoromethyl radicals.

The alkoxy radical having from 1 to 20 carbons that may be used as $X^1$ or $X^2$ has a structure represented by —OY. Here, Y may be selected from the group consisting of the above-mentioned substituted or unsubstituted alkyl radicals of 1 to 20 carbons, cycloalkyl radicals of 3 to 20 carbons, and haloalkyl radicals of 1 to 20 carbons. Y is preferably selected from the group consisting of the above-mentioned unsubstituted alkyl radicals, and substituted or unsubstituted cycloalkyl radicals.

Examples of alkenyl radicals which may be used as $X^1$ and $X^2$ include vinyl, 1-propenyl, 2-propenyl, butenyl, pentenyl, hexenyl, heptenyl, octenyl, nonenyl, decenyl, undecenyl, dodecenyl, tridecenyl, tetradecenyl, pentadecenyl, hexadecenyl, heptadecenyl, octadecenyl and structural isomers thereof.

$X^1$ and $X^2$ are preferably selected from the group consisting of hydrogen, substituted or unsubstituted alkyl radicals of 1 to 20 carbons, and cycloalkyl radicals of 3 to 20 carbons. $X^1$ and $X^2$ are more preferably selected from the group consisting of hydrogen, unsubstituted alkyl radicals of 1 to 20 carbons, and cycloalkyl radicals of 3 to 20 carbons.

Illustrative examples of the crystalline oligothiophene compound of formula (1) are shown below.

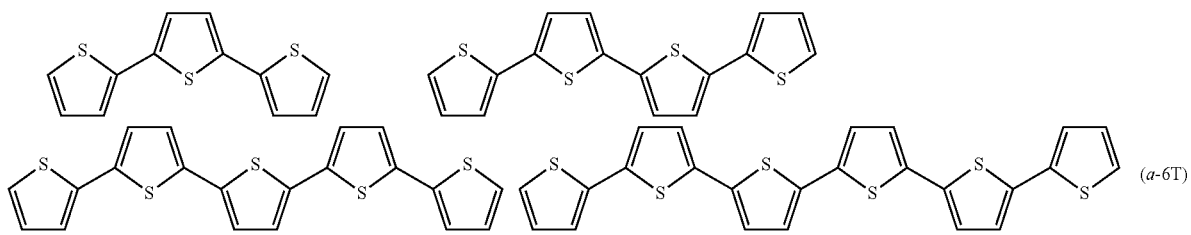

(a-6T)

-continued
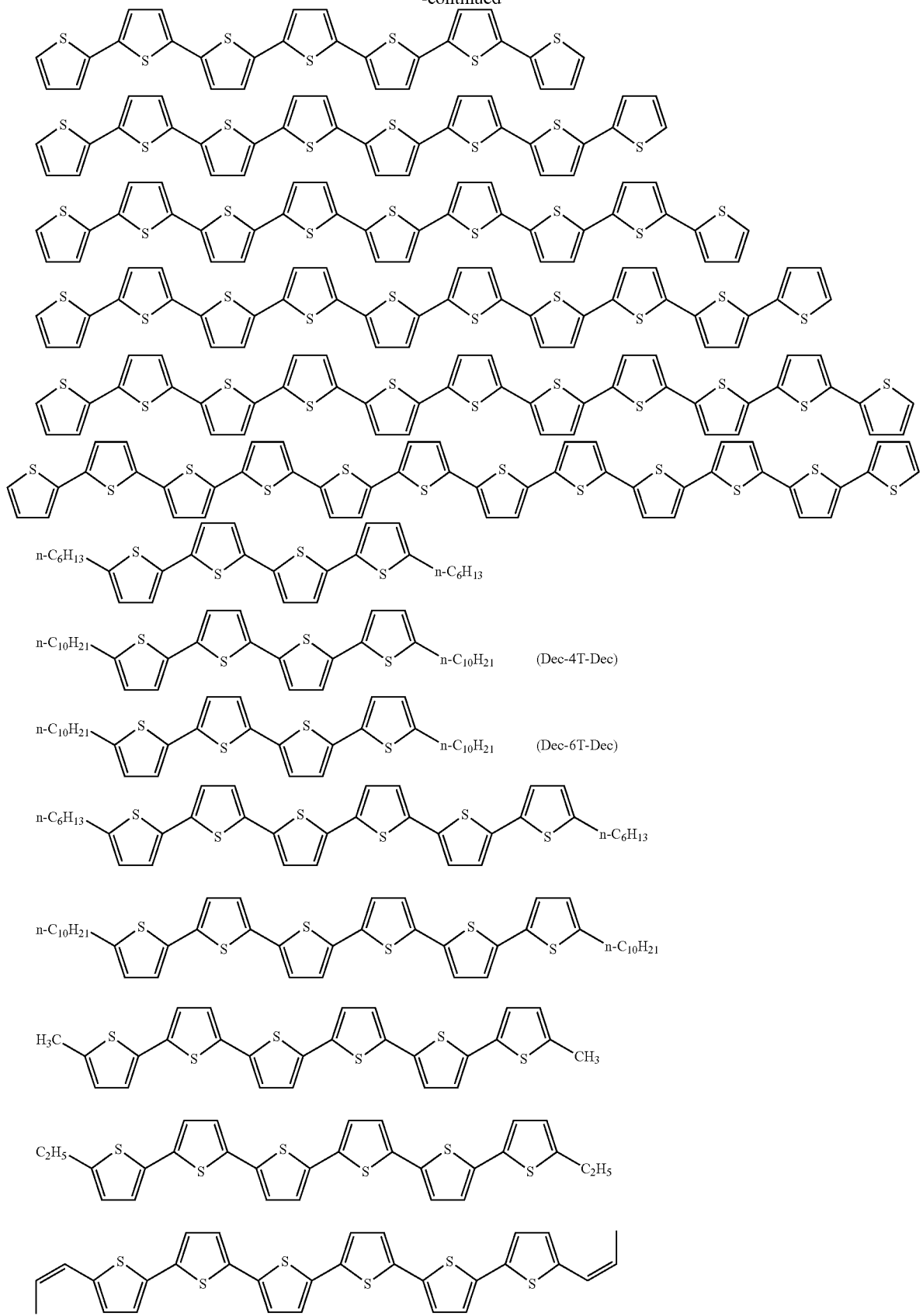

Alternatively, the damage-mitigating electron injection layer 135 may be formed using a crystalline oligothiophene compound having the structure of formula (2).

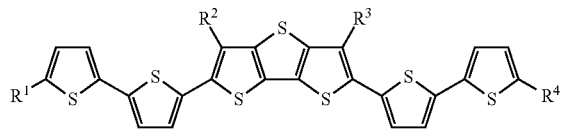

(2)

Here, $R^1$, $R^2$, $R^3$ and $R^4$ are each independently selected from the group consisting of hydrogen and substituted or unsubstituted monovalent radicals. $R^1$, $R^2$, $R^3$ and $R^4$ are preferably each independently selected from the group consisting of hydrogen, alkyl radicals of 1 to 20 carbons, cycloalkyl radicals of 3 to 20 carbons, haloalkyl radicals of 1 to 20 carbons, and alkoxy radicals of 1 to 20 carbons. $R^1$, $R^2$, $R^3$ and $R^4$ are more preferably each independently selected from the group consisting of hydrogen, alkyl radicals of 1 to 20 carbons, and cycloalkyl radicals of 3 to 20 carbons.

Specific examples of alkyl radicals of 1 to 20 carbons, cycloalkyl radicals of 3 to 20 carbons, haloalkyl radicals of 1 to 20 carbons, and alkoxy radicals of 1 to 20 carbons are the same as those mentioned in connection with $X^1$ and $X^2$ above.

A specific example of a crystalline oligothiophene compound of formula (2) is shown below.

SrO and BeO. Examples of halides that may be used as n-type dopants include alkali metal fluorides such as LiF, NaF and KF; alkali metal chlorides such as LiCl, KCl and NaCl; and alkaline earth metal fluorides such as $CaF_2$, $BaF_2$, $SrF_2$, $MgF_2$ and $BeF_2$. Examples of carbonates that may be used as n-type dopants preferably include alkali metal carbonates such as $Li_2CO_3$, $Na_2CO_3$, $K_2CO_3$ and $Cs_2CO_3$.

Formation of the damage-mitigating electron injection layer 135 using a crystalline oligothiophene compound may be preferably carried out by a vacuum deposition process or by a pulsed laser deposition process using a microwave laser (laser ablation). Alternatively, in cases where adverse effects such as dissolution of the underlying organic layers (electron transport layer 134, emissive layer 133, hole transport layer 132, hole injection layer 131, etc.) can be eliminated, the damage-mitigating electron injection layer 135 may be formed by a wet film-forming method using a dispersion or solution of the crystalline oligothiophene compound. Wet film-forming methods that may be used include spin-coating, inkjet printing, and various other types of printing methods.

On the other hand, formation of the damage-mitigating electron injection layer 135 using a crystalline oligothiophene compound and an n-type dopant may be carried out by co-deposition of the crystalline oligothiophene compound and the n-type dopant using, for example, a vacuum heating evaporation process or an electron beam evaporation process. Alternatively, in cases where adverse effects to the underlying organic layers can be eliminated, the damage-mitigating elec-

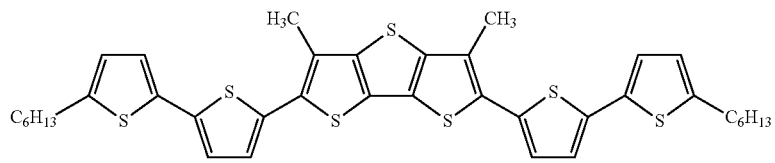

In the present invention, it is preferable to add an impurity having electron-donating properties as an n-type dopant to the damage-mitigating electron injection layer 135 composed of a crystalline oligothiophene compound. By adding an n-type dopant, a good electron injectability can be obtained even when used in a transparent cathode 140 formed of a TCO material having a large work function. Moreover, the electrical conductivity of the damage-mitigating electron injection layer 135 improves, making it possible to increase the film thickness of the damage-mitigating electron injection layer 135 without an accompanying rise in the driving voltage of the element. In this way, it is possible to achieve the effects of increasing the degree of freedom in optical design by increasing the breadth of the film thickness selection, and to prevent electrical short failures between the transparent cathode 140 and the anode 120.

n-Type dopants that may be used include one or a plurality of alkali metals selected from the group consisting of lithium, sodium, potassium, rubidium and cesium, and one or a plurality of alkaline earth metal elements selected from the group consisting of beryllium, magnesium, calcium, strontium and barium. Oxides, halides, carbonates and chelate compounds of the above alkali metals, and oxides, halides, carbonates or chelate compounds of the above alkaline earth metals are also capable of exhibiting similar effects as n-type dopants. Specific examples of oxides that may be used as n-type dopants include alkali metal oxides such as $Li_2O$, LiO, $Na_2O$, $K_2O$ and $Cs_2O$, and alkaline earth metal oxides such as CaO, BaO, tron injection layer 135 may be formed by a wet film-forming method using a material solution obtained by adding a specific concentration of n-type dopant to a solution or dispersion of the crystalline oligothiophene compound.

The damage-mitigating electron injection layer 135 of the present invention has the function of mitigating damage, such as damage due to plasma, film-forming particle collisions and material oxidation, to the underlying organic layers (electron transport layer 134, emissive layer 133, etc.) when the transparent cathode 140 is formed by sputtering the TCO material. From this standpoint, the thickness of the damage-mitigating electron injection layer 135 is an important parameter governing the performance of the organic EL element 100. By increasing the thickness of the damage-mitigating electron injection layer 135, the ability to mitigate damage to the underlying organic layers can be enhanced. On the other hand, because crystalline oligothiophene compounds sometimes have an absorption band in the visible light wavelength region, increasing the thickness of the damage-mitigating electron injection layer 135 may lower the emission efficiency of the organic EL element 100 due to the absorption of light of the emissive layer 133. Taking into account the balance between these two opposing effects, the damage-mitigating electron injection layer 135 of the invention has a thickness of preferably from 5 to 100 nm, and more preferably from 5 to 50 nm.

Because the damage-mitigating electron injection layer 135 formed as described above and composed of a crystalline oligothiophene compound and an n-type dopant (when present) assumes a dense polycrystalline structure, in addition to exhibiting a good electron conductivity, it is able to effectively prevent plasma-induced damage, film-forming particle collisions and oxidative deterioration of organic layers such as the electron transport layer 134 and the emissive layer 133 during formation of the transparent cathode 140.

Transparent Cathode 140:

It is required that the transparent cathode 140 used in the present invention be light-transmitting. Therefore, the transparent cathode 140 is preferably formed using a TCO material. TCO materials that may be used include indium-tin oxide (ITO), indium-zinc oxide (IZO), indium-tungsten oxide (IWO), aluminum-doped zinc oxide (AZO) and gallium-doped zinc oxide (GZO).

The transparent cathode 140 may be fabricated by using a process such as vapor deposition or sputtering to form a thin-film of TCO material on the damage-mitigating electron injection layer 135. Preferably, the transparent cathode 140 may be fabricated by using a sputtering process, ion plating process or reactive plasma film-forming process that has been established in liquid-crystal display manufacturing technology or plasma display manufacturing technology.

Electrode Structure:

By forming the anode 120 and the transparent cathode 140 each as a monolithic electrode, the organic EL element of the invention may be used as a surface-emitting light source capable of use for illumination. Alternatively, by forming a plurality of independently drivable light-emitting components as subsequently described, use in display applications is also possible.

For example, by having the anode 120 and the transparent cathode 140 each composed of a plurality of stripe-shaped partial electrodes, and by having the partial electrodes of the anode 120 extend in a direction which intersects with the direction in which the partial electrodes of the transparent cathode 140 extend, a so-called passive-matrix drive organic EL element can be obtained. It is preferable for the direction in which the partial electrodes of the anode 120 extend and the direction in which the partial electrodes of the transparent cathode 140 extend to be orthogonal. In a passive-matrix drive organic EL element, by selecting one partial electrode of the anode 120 and one partial electrode of the transparent cathode 140 and applying a suitable voltage therebetween, the position at which these partial electrodes intersect will emit light.

Alternatively, by forming on a substrate 110 a plurality of switching elements made up of thin-film transistors (TFT) or the like and forming interconnections for the switching elements, by having the anode 120 composed of a plurality of partial electrodes and connecting each of the partial electrodes one-to-one with a switching element, and by having the transparent cathode 140 composed of a monolithic common electrode, a so-called active-matrix drive organic EL element can be obtained. In an active-matrix drive organic EL element, illumination takes place at the positions corresponding to the partial electrodes of the anode 120 which are connected to the desired switching elements.

Example 1

Fabrication of Transparent Organic EL Element

An IZO film was formed by DC magnetron sputtering (target, $In_2O_3$+10 wt % ZnO; discharge gas, Ar+0.5% $O_2$; discharge pressure, 0.3 Pa; discharge power, 1.45 W/cm$^2$; substrate transport rate, 162 mm/min) on a substrate 110 composed of Eagle 2000 glass (manufactured by Corning) having a length of 50 mm, a width of 50 mm and a thickness of 0.7 mm, and shaped by photolithography into a 2 mm wide stripe, thereby forming an anode 120 (IZO electrode) having a film thickness of 150 nm and a width of 2 mm.

Next, an organic EL layer 130 composed of five layers was formed on the anode 120 without breaking the vacuum. First, a 20 nm thick 2-TNATA film was formed by resistance heating evaporation at a deposition rate of 1 Å/s to give a hole injection layer 131. A 40 nm thick NPB film was then formed on top thereof by resistance heating evaporation at a deposition rate of 1 Å/s to give a hole transport layer 132. Next, the co-deposition of ADN and DPAVBi as the light-emitting dopant was carried out to form a 30 nm thick emissive layer 133. At this time, the ADN deposition rate was set to 1 Å/s and the DPAVBi deposition rate was set to 0.03 Å/s. Next, a 30 nm thick $Alq_3$ film was formed by vapor deposition at a deposition rate of 1 Å/s to form an electron transport layer 134. Then a 20 nm thick α-sexithiophene (α-6T) film was formed on the electron transport layer 134 by vacuum evaporation at a deposition rate of 1 Å/s, thereby forming a damage-mitigating electron injection layer 135. In the formation by vacuum evaporation of the above five layers which make up the organic EL layer 130, the final vacuum within the deposition chamber was set to $10^{-5}$ Pa or below, and the degree of vacuum during deposition was set on the order of $10^{-5}$ Pa.

Next, the multilayer stack that forms organic EL layer 130 was transferred into a DC magnetron sputtering system without breaking the vacuum. An IZO film was deposited by a DC magnetron sputtering process (target, $In_2O_3$+10 wt % ZnO; discharge gas, Ar+0.5% $O_2$; discharge pressure, 0.3 Pa; discharge power, 1.45 W/cm$^2$; substrate transport rate, 162 mm/min) through a metal mask having a 1 mm wide slit, thereby forming a transparent cathode 140 (IZO electrode) having a thickness of 140 nm and a width of 2 mm. In this step, because the metal mask and the substrate incurring film formation were not in close contact, a transparent cathode 140 having a width of 2 mm was obtained using a 1 mm wide slit.

Next, the multilayer stack on which a transparent cathode 140 had been formed was transferred to a nitrogen-purged dry box to prevent contact with the atmosphere. Within the dry box, a sealing glass plate coated with an epoxy adhesive mixed with 10 μm diameter glass bead spacers (41 mm (L)× 41 (W)×0.7 mm (T); OA-10, manufactured by Nippon Electric Glass) was laminated onto the multilayer stack near the four sides thereof so as to cover the organic EL layer 130, thereby giving a transparent blue light-emitting EL element.

Example 2

Fabrication of Transparent Organic EL Element

Aside from changing the thickness of the electron transport layer 134 composed of $Alq_3$ to 20 nm and changing the thickness of the damage-mitigating electron injection layer 135 composed of α-6T to 30 nm, a transparent organic EL element was manufactured by the same procedure as in Example 1.

Example 3

Fabrication of Top-Emitting Organic EL Element

A substrate 100 composed of Eagle 2000 glass (manufactured by Corning) having a length of 50 mm, a width of 50 mm and a thickness of 0.7 mm was prepared for use. First, the substrate 100 was washed with an alkali wash solution and thoroughly rinsed with pure water. Next, a 100 nm thick silver alloy (APC-TR, manufactured by Furuya Metal) film was formed by DC magnetron sputtering on the washed substrate 100. A 1.3 μm thick photoresist (TFR-1250, manufactured by Tokyo Ohka Kogyo) film was then formed on the silver alloy film by spin coating, and dried in a 80° C. clean oven over a period of 15 minutes. The photoresist film was irradiated with ultraviolet light from a high-pressure mercury vapor lamp through a photomask having a 2 mm wide stripe pattern, then developed with a developer (NMD-3, manufactured by Tokyo Ohka Kogyo), thereby fabricating a 2 mm wide photoresist pattern on the silver alloy film. Next, etching of the silver alloy film was carried out using a silver etchant (SEA2, manufactured by Kanto Chemical), following which the photoresist pattern was stripped using a stripper (Stripper 104, manufactured by Tokyo Ohka Kogyo), thereby fabricating a metal layer composed of stripe-shaped areas having a linewidth of 2 mm.

Subsequently, aside from setting the substrate transport rate at 178 mm/min, the same DC magnetron sputtering method as in Example 1 was used to form an IZO film having a thickness of 100 nm on the metal layer. Next, aside from using oxalic acid as the etchant, patterning was carried out by the same photolithographic method as for the silver alloy film so as to form a transparent conductive layer composed of stripe-shaped portions which coincide with the metal layer pattern, thereby obtaining a reflecting anode 120 having a stacked structure composed of a metal layer and a transparent conductive layer. The substrate on which the reflecting anode 120 had been formed was then treated for 10 minutes at room temperature in a UV/$O_3$ cleaning system equipped with a low-pressure mercury vapor lamp.

Formation of the organic EL layer 130 and the transparent cathode 140, as well as sealing, were then carried out by the same procedure as in Example 2, thereby giving a Top-Em blue-emitting organic EL element which includes a damage-mitigating electron injection layer 135 composed of α-6T.

Example 4

Aside from using α,ω-didecylsexithiophene (Dec-6T-Dec) instead of μ-6T to form the damage-mitigating electron injection layer 135, a Top-Em blue-emitting organic EL element was obtained by the same procedure as in Example 3.

Example 5

Aside from using α,ω-didecylquaterthiophene (Dec-4T-Dec) instead of α-6T to form the damage-mitigating electron injection layer 135, a Top-Em blue-emitting organic EL element was obtained by the same procedure as in Example 3.

Example 6

Aside from using 1,3,5-tris(2-N-phenylbenzimidazolyl) benzene (TPBI) instead of $Alq_3$ to form an electron transport layer, a Top-Em blue-emitting organic EL element was obtained by the same procedure as in Example 3.

Comparative Example 1

Aside from changing the thickness of the electron transport layer composed of $Alq_3$ to 50 nm and forming a 1 nm thick electron injection layer using, instead of α-6T, LiF which has hitherto been used in Btm-Em organic EL elements, a Top-Em blue-emitting organic EL element was fabricated in the same way as in Example 3. Here, the electron injection layer composed of LiF was formed by carrying out vapor deposition at a deposition rate of 0.2 Å/s through the resistance heating of LiF powder placed within a molybdenum crucible.

Comparative Example 2

Aside from using TPBI instead of $Alq_3$ to form an electron transport layer, a Top-Em blue-emitting organic EL element was fabricated by the same procedure as in Comparative Example 1.

Evaluation

The voltages and current efficiencies of the organic EL elements obtained in Examples 1 to 6 and Comparative Examples 1 and 2 when caused to luminesce at a current density of 10 mA/cm$^2$ were measured. The measurement results are presented in Table 1. The current efficiencies of the transparent organic EL elements in Examples 1 and 2 were obtained by measuring the luminescence observed through the transparent anode 120/substrate 110. On the other hand, the current efficiencies of the Top-Em blue-emitting organic EL elements in Examples 3 to 6 and Comparative Examples 1 and 2 were obtained by measuring the luminescence observed through the transparent cathode 140/sealing glass plate.

TABLE 1

Properties of EL elements at current density of 10 mA/cm$^2$

| | Type of element | EIL (thickness, nm) | EIL (thickness, nm) | Voltage (V) | Current efficiency (cd/A) |
|---|---|---|---|---|---|
| Comp. Ex. 1 | Top-Em | LiF (1) | $Alq_3$ (50) | 8.0 | — |
| Comp. Ex. 2 | Top-Em | LiF (1) | TPBI (50) | 7.2 | — |
| Example 1 | Transparent | α-6T (20) | $Alq_3$ (30) | 7.2 | 3.9 |
| Example 2 | Transparent | α-6T (30) | $Alq_3$ (20) | 7.0 | 4.3 |
| Example 3 | Top-Em | α-6T (30) | $Alq_3$ (20) | 7.0 | 10.4 |
| Example 4 | Top-Em | Dec-6T-Dec (30) | $Alq_3$ (20) | 7.1 | 10.0 |
| Example 5 | Top-Em | Dec-4T-Dec (30) | $Alq_3$ (20) | 6.8 | 9.6 |
| Example 6 | Top-Em | α-6T (30) | TPBI (20) | 6.0 | 11.2 |

In the elements of Comparative Examples 1 and 2 which included an electron injection layer composed of a 1 nm thick LiF film, current flowed to the element, but luminescence was not observed. The reason is thought to be that the electron transport layer incurred damage during formation of the transparent cathode by sputtering, and deteriorated.

By contrast, in organic EL elements having a damage-mitigating electron injection layer 135 composed of a crystalline oligothiophene compound according to the present invention, good luminescent properties were obtained in both transparent organic EL elements (Examples 1 and 2) and Top-Em organic EL elements (Examples 3 to 6).

The above results demonstrate that, by adopting the organic EL element configuration of the present invention which includes a damage-mitigating electron injection layer 135 formed from a crystalline oligothiophene compound, even in cases where a top cathode composed of TCO material is formed by sputtering, an organic EL element which exhibits a high emission efficiency and a low driving voltage can be provided.

The invention claimed is:

1. An organic EL element comprising, in the order recited:
a substrate;
an anode;
an organic EL layer which includes at least an emissive layer, an electron transport layer and a damage-mitigating electron injection layer; and
a transparent cathode composed of a transparent conductive oxide material,
wherein the damage-mitigating electron injection layer is in contact with the transparent cathode and includes a crystalline oligothiophene compound represented by formula (2) below:

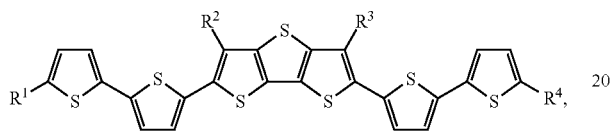

(2)

where $R^1$, $R^2$, $R^3$ and $R^4$ are each independently selected from the group consisting of hydrogen and substituted or unsubstituted monovalent radicals.

2. The organic EL element according to claim 1, wherein $R^1$ and $R^4$ are both n-hexyl, and wherein $R^2$ and $R^3$ are both methyl.

3. The organic EL element according to claim 1, wherein the electron injection layer further includes a substance which exhibits electron-donating properties with respect to the crystalline oligothiophene compound.

4. The organic EL element according to claim 3, wherein the substance which exhibits electron-donating properties is selected from the group consisting of alkali metals and alkaline earth metals, wherein the alkali metals are selected from the group consisting of lithium, potassium, sodium, rubidium and cesium, and wherein the alkaline earth metals are selected from the group consisting of beryllium, magnesium, calcium, strontium and barium.

5. The organic EL element according to claim 3, wherein the substance which exhibits electron-donating properties is selected from the group consisting of alkali metal oxides, alkali metal halides, alkali metal carbonates, alkali metal chelate compounds, alkaline earth metal oxides, alkaline earth metal halides, alkaline earth metal carbonates and alkaline earth metal chelate compounds, wherein the alkali metal is selected from the group consisting of lithium, potassium, sodium, rubidium and cesium, and wherein the alkaline earth metal is selected from the group consisting of beryllium, magnesium, calcium, strontium and barium.

6. A method of manufacturing the organic EL element according to claim 1, the method comprising the steps of:
forming an anode on a substrate;
forming, on the anode, an organic EL layer which includes at least an emissive layer, an electron transport layer and a damage-mitigating electron injection layer; and
forming, on the organic EL layer, a transparent cathode composed of a transparent conductive oxide material,
wherein the damage-mitigating electron injection layer is formed by using a vacuum evaporation process to deposit a crystalline oligothiophene compound represented by formula (2) below:

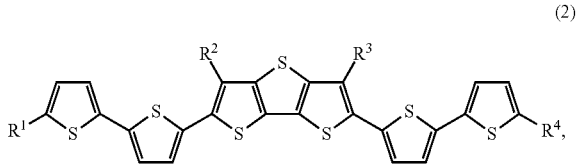

(2)

where $R^1$, $R^2$, $R^3$ and $R^4$ are each independently selected from the group consisting of hydrogen and substituted or unsubstituted monovalent radicals.

7. The method of manufacturing an organic EL element according to claim 6, wherein $R^1$ and $R^4$ are both n-hexyl, and wherein $R^2$ and $R^3$ are both methyl.

8. The organic EL element according to claim 1, wherein the electron injection layer further includes a substance which exhibits electron-donating properties with respect to the crystalline oligothiophene compound.

9. The organic EL element according to claim 2, wherein the electron injection layer further includes a substance which exhibits electron-donating properties with respect to the crystalline oligothiophene compound.

* * * * *